US010630064B2

(12) United States Patent
Matsumura et al.

(10) Patent No.: US 10,630,064 B2
(45) Date of Patent: Apr. 21, 2020

(54) WIRING GUIDE MECHANISM AND ELECTRONIC DEVICE

(71) Applicant: HITACHI HIGH-TECHNOLOGIES CORPORATION, Minato-ku, Tokyo (JP)

(72) Inventors: Jin Matsumura, Tokyo (JP); Hiroyuki Higashino, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 16/465,469

(22) PCT Filed: Dec. 1, 2016

(86) PCT No.: PCT/JP2016/085715
§ 371 (c)(1),
(2) Date: May 30, 2019

(87) PCT Pub. No.: WO2018/100710
PCT Pub. Date: Jun. 7, 2018

(65) Prior Publication Data
US 2019/0296536 A1    Sep. 26, 2019

(51) Int. Cl.
*H02G 11/00* (2006.01)
*H05K 5/02* (2006.01)
(Continued)

(52) U.S. Cl.
CPC ............... *H02G 11/00* (2013.01); *G06F 1/16* (2013.01); *G06F 1/1683* (2013.01);
(Continued)

(58) Field of Classification Search
CPC .... H02G 11/00; H05K 5/0226; H05K 5/0247; G06F 1/1683
See application file for complete search history.

(56) References Cited

U.S. PATENT DOCUMENTS

2002/0112320 A1* 8/2002 Hayashi .............. B60R 16/0207
16/386
2013/0342974 A1* 12/2013 Hung .................... G06F 1/1681
361/679.01

FOREIGN PATENT DOCUMENTS

JP   H02-80831U U    6/1990
JP   H07-302986 A    11/1995
(Continued)

OTHER PUBLICATIONS

International Search Report for International Application No. PCT/JP2016/085715, dated Jan. 17, 2017.
(Continued)

*Primary Examiner* — Timothy J Thompson
*Assistant Examiner* — Amol H Patel
(74) *Attorney, Agent, or Firm* — Miles & Stockbridge, P.C.

(57) ABSTRACT

The present invention comprises: hinge members which rotatably link a device body and a door; wires which electrically connect the door side with the device body side; and a moving-side wiring retention member and fixed-side wiring retention member which retain the wires and are attached to the hinge members. The moving-side wiring retention member and the fixed-side wiring retention member are disposed spaced apart in an axial direction of the hinge members. The moving-side wiring retention member and the fixed-side wiring retention member rotate relative to each other on the same axis in accordance with a rotation operation of the door.

11 Claims, 15 Drawing Sheets

(51) Int. Cl.
*H05K 5/03* (2006.01)
*G06F 1/16* (2006.01)
*H05K 7/00* (2006.01)

(52) U.S. Cl.
CPC ......... *H05K 5/0226* (2013.01); *H05K 5/0247* (2013.01); *H05K 5/03* (2013.01); *H05K 7/00* (2013.01); *G06F 1/1616* (2013.01)

(56) References Cited

FOREIGN PATENT DOCUMENTS

| | | |
|---|---|---|
| JP | 2001-281221 A | 10/2001 |
| JP | 2006067267 A | 3/2006 |

OTHER PUBLICATIONS

Written Opinion for International Application No. PCT/JP2016/085715, dated Jan. 17, 2017.

\* cited by examiner

[FIG. 1]
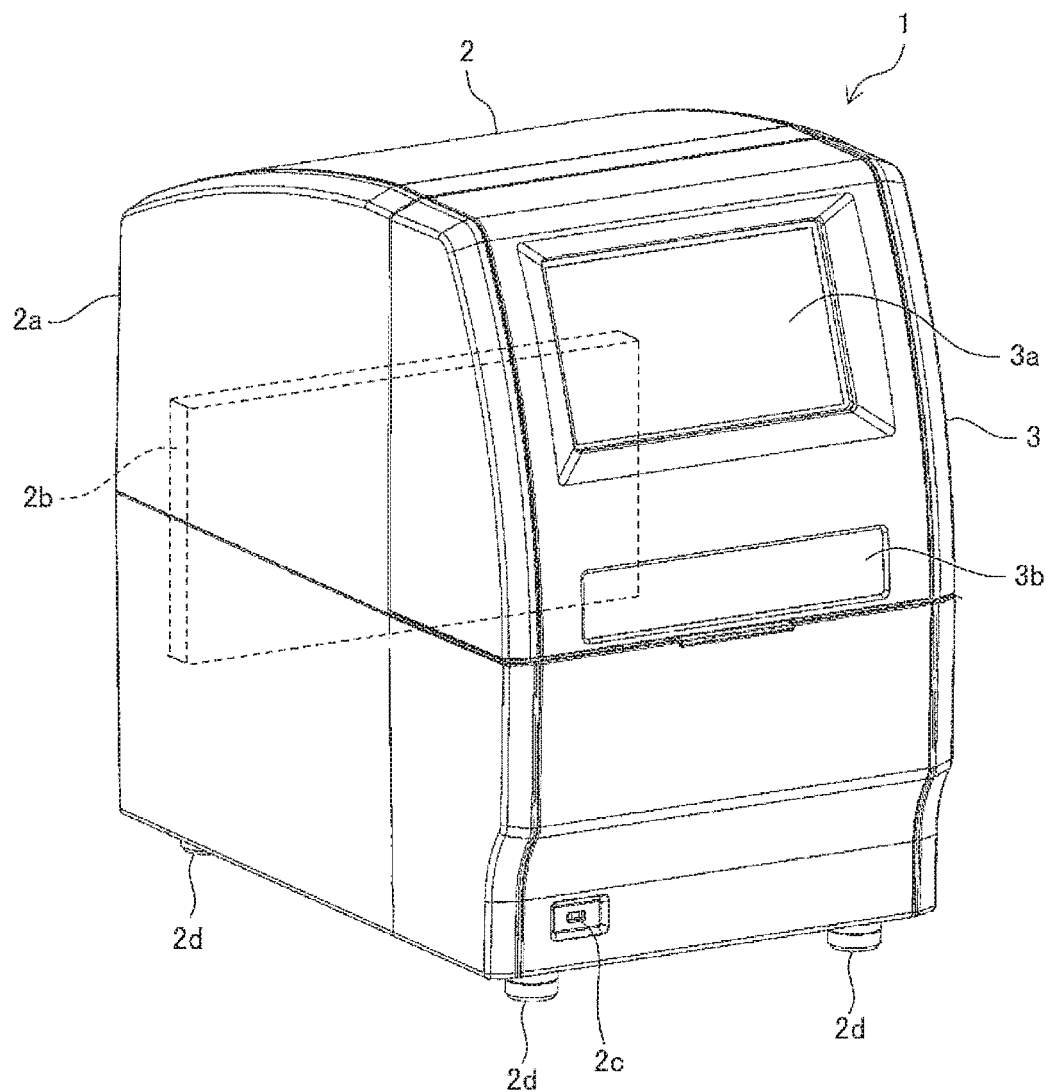

[FIG. 2]
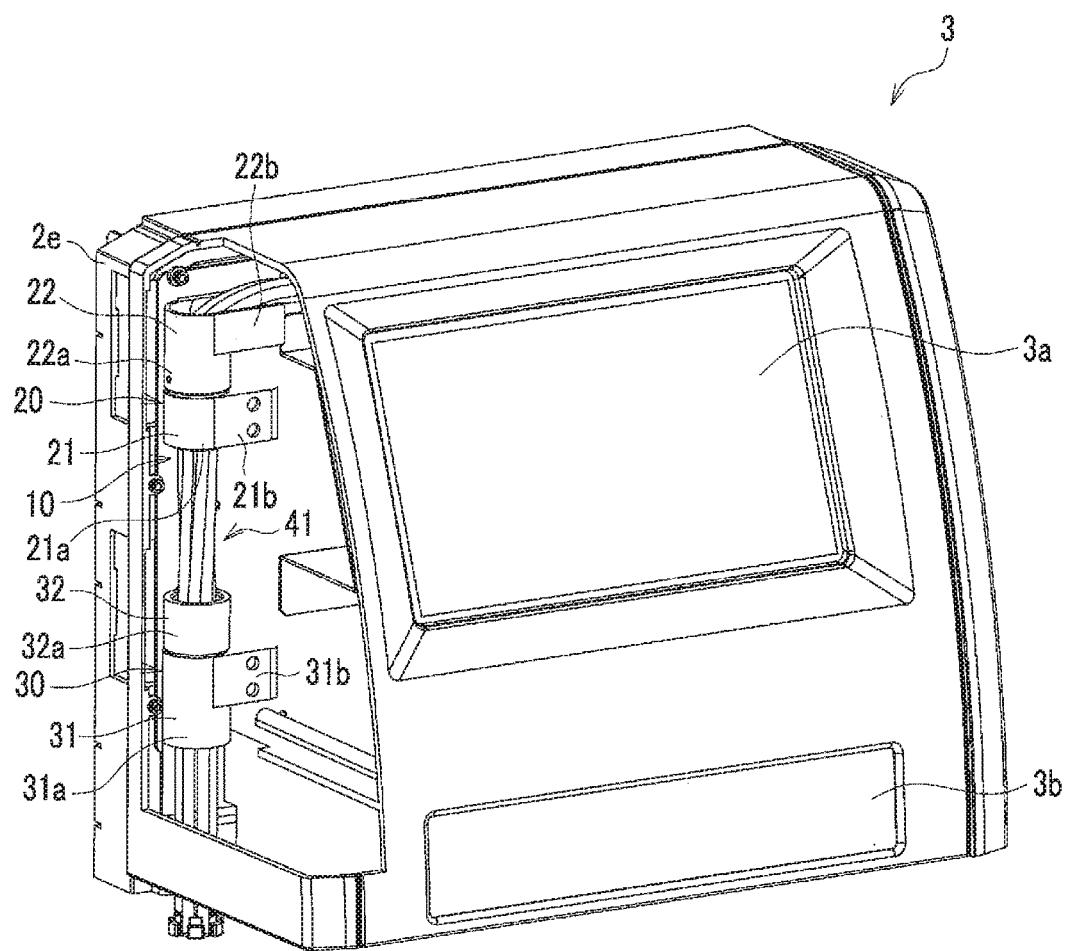

[FIG. 3]
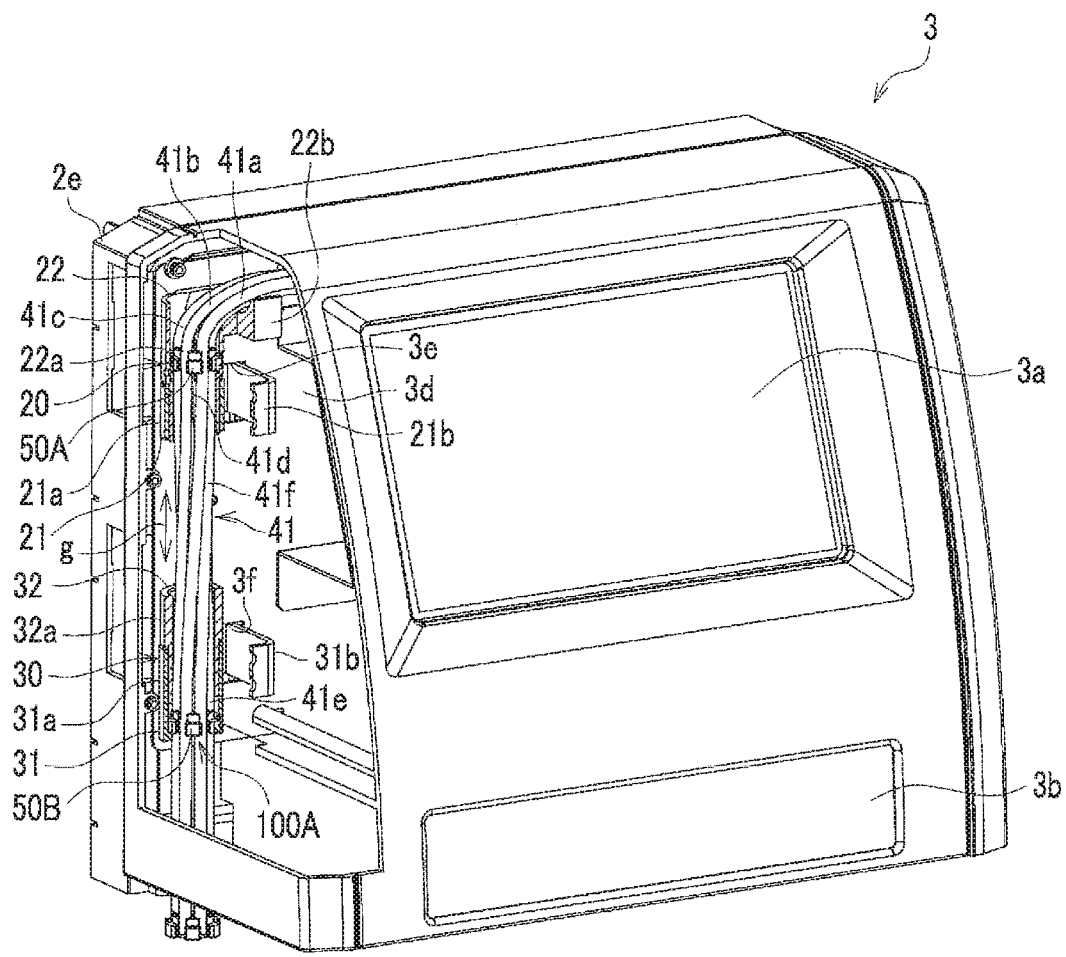

[FIG. 4]
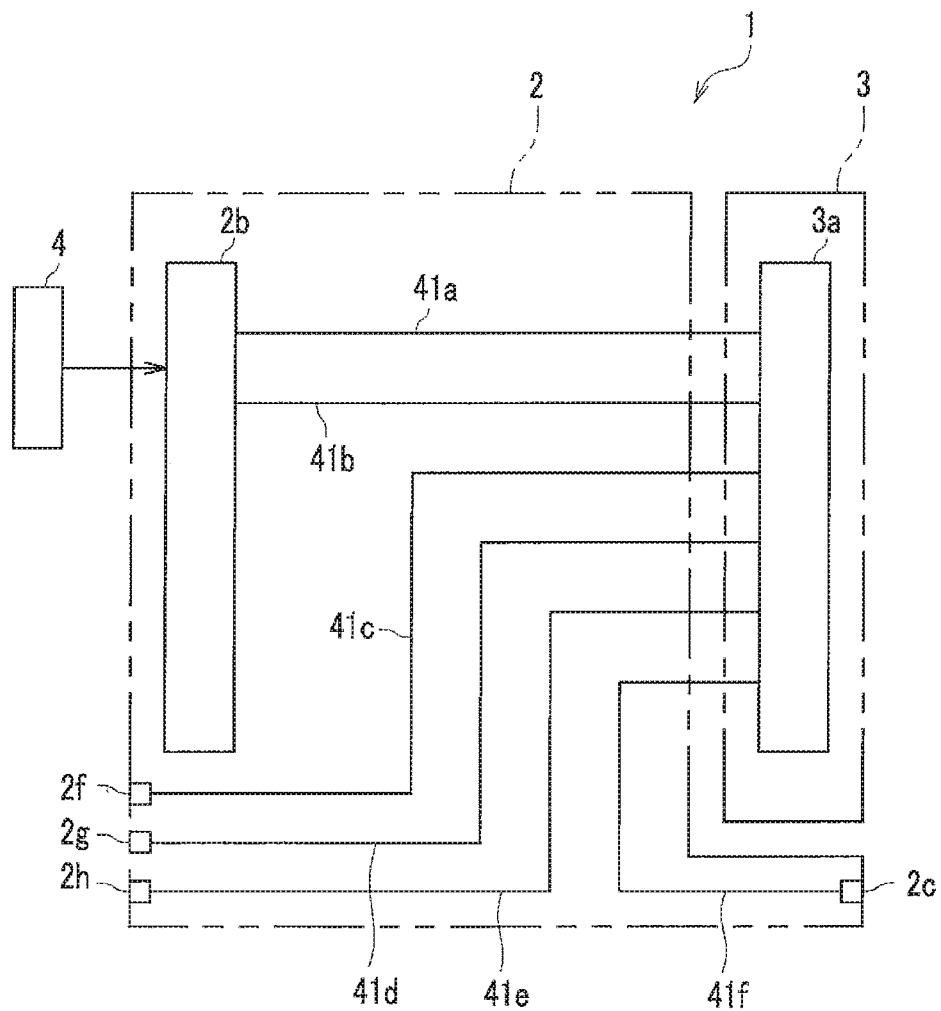

[FIG. 5]
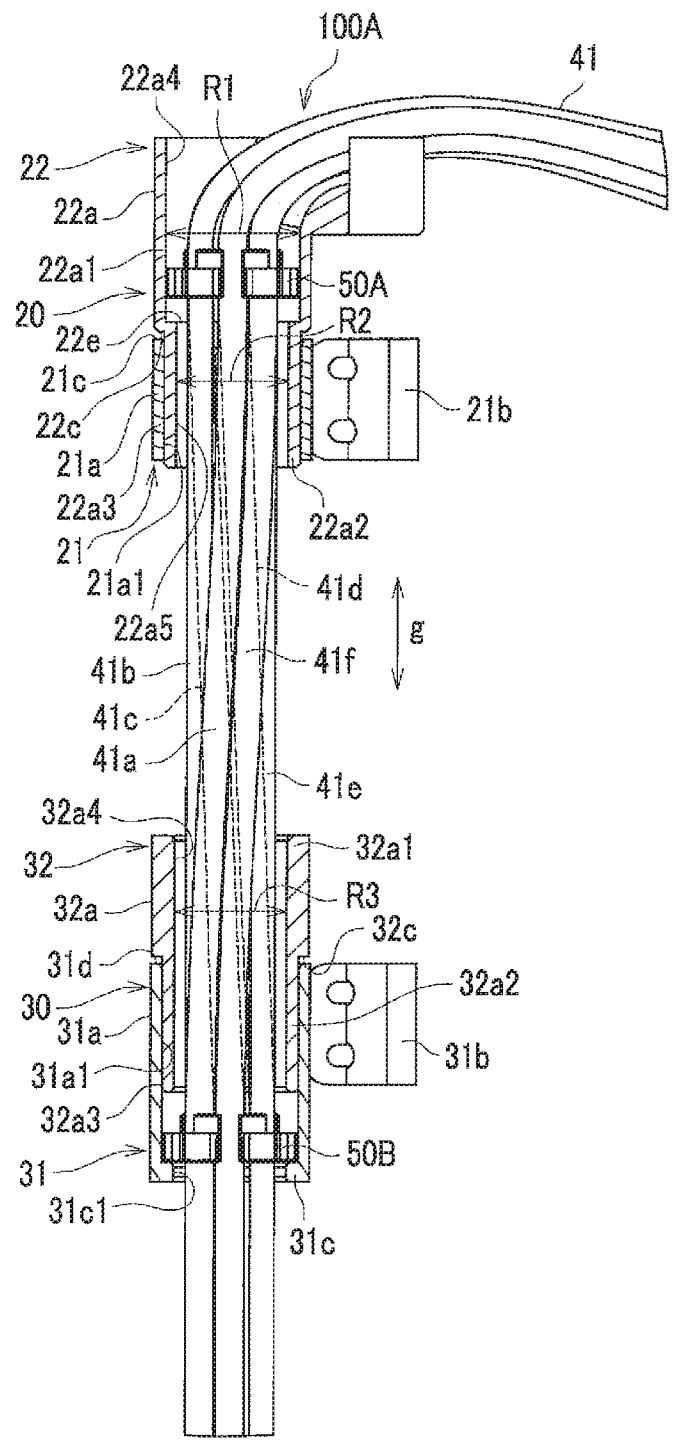

[FIG. 6]
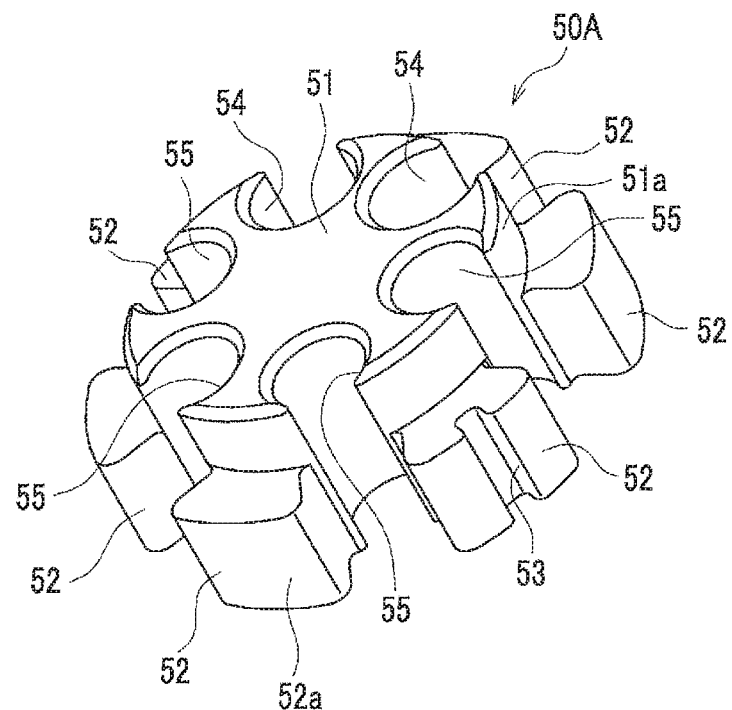
[FIG. 7]
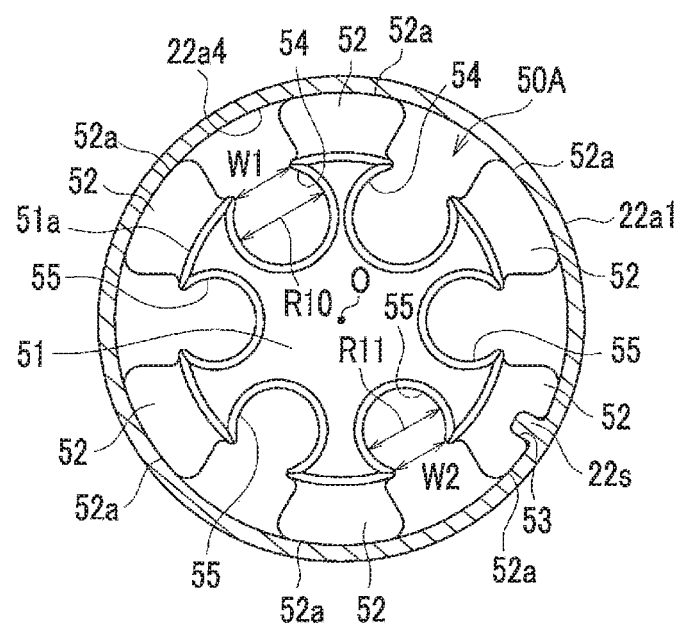

[FIG. 8]
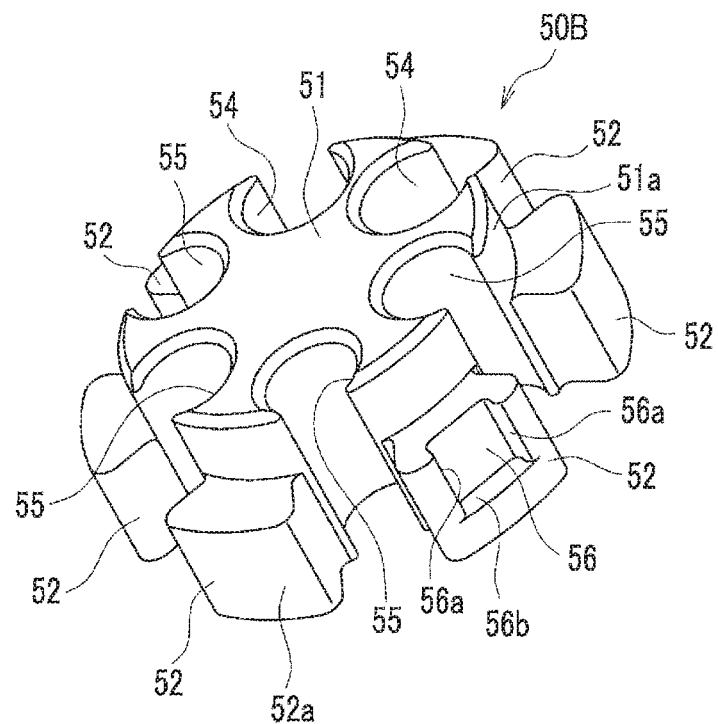
[FIG. 9]
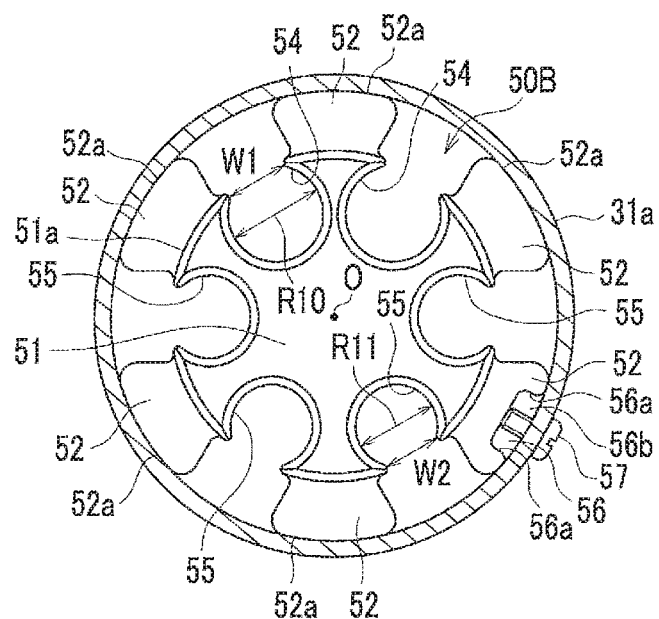

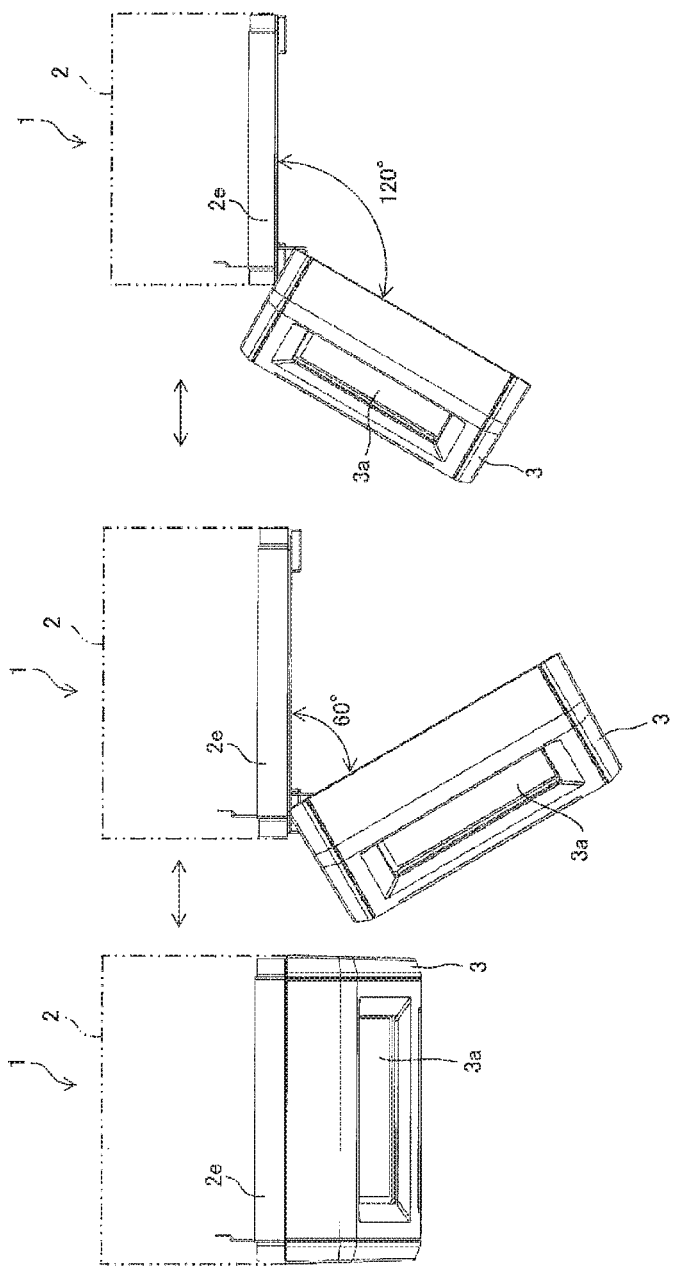
[FIG 10]

[FIG. 11]
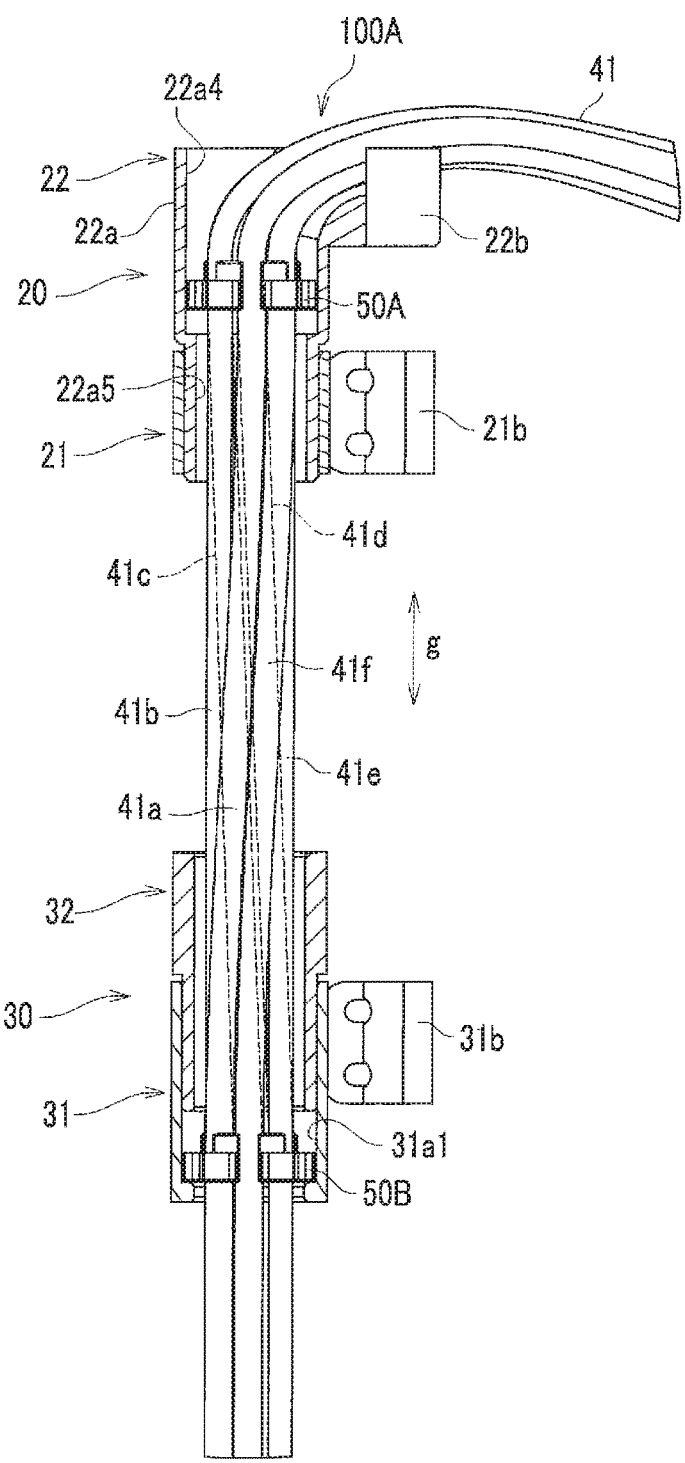

[FIG. 12]
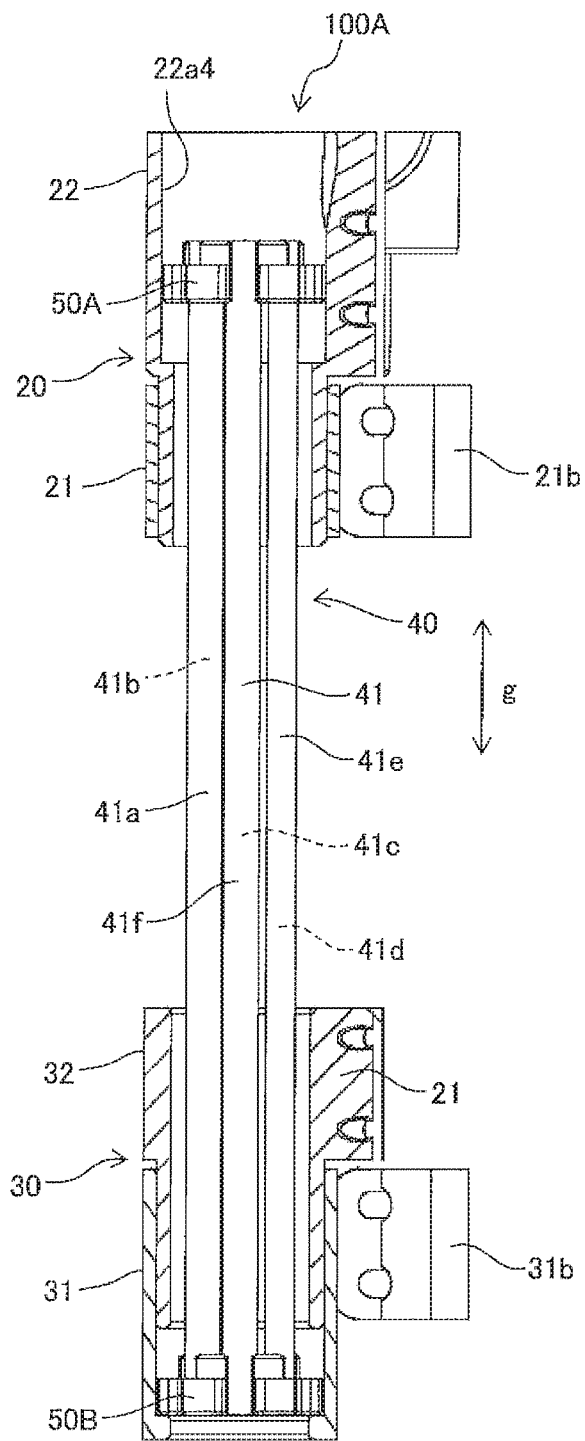

[FIG. 13]
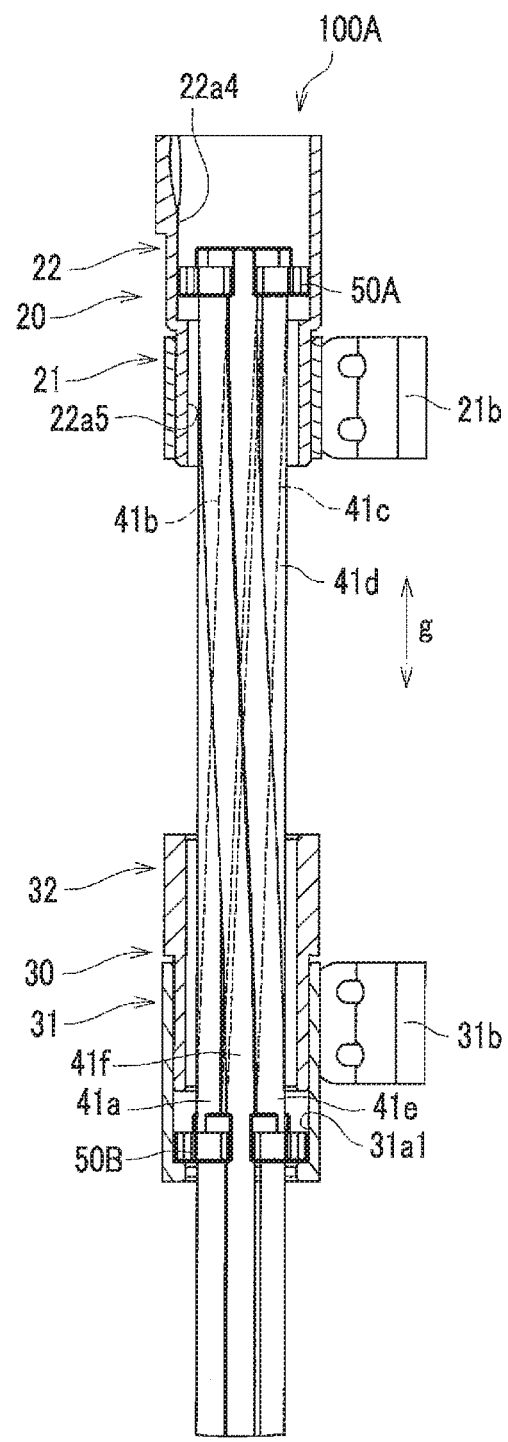

[FIG. 14]
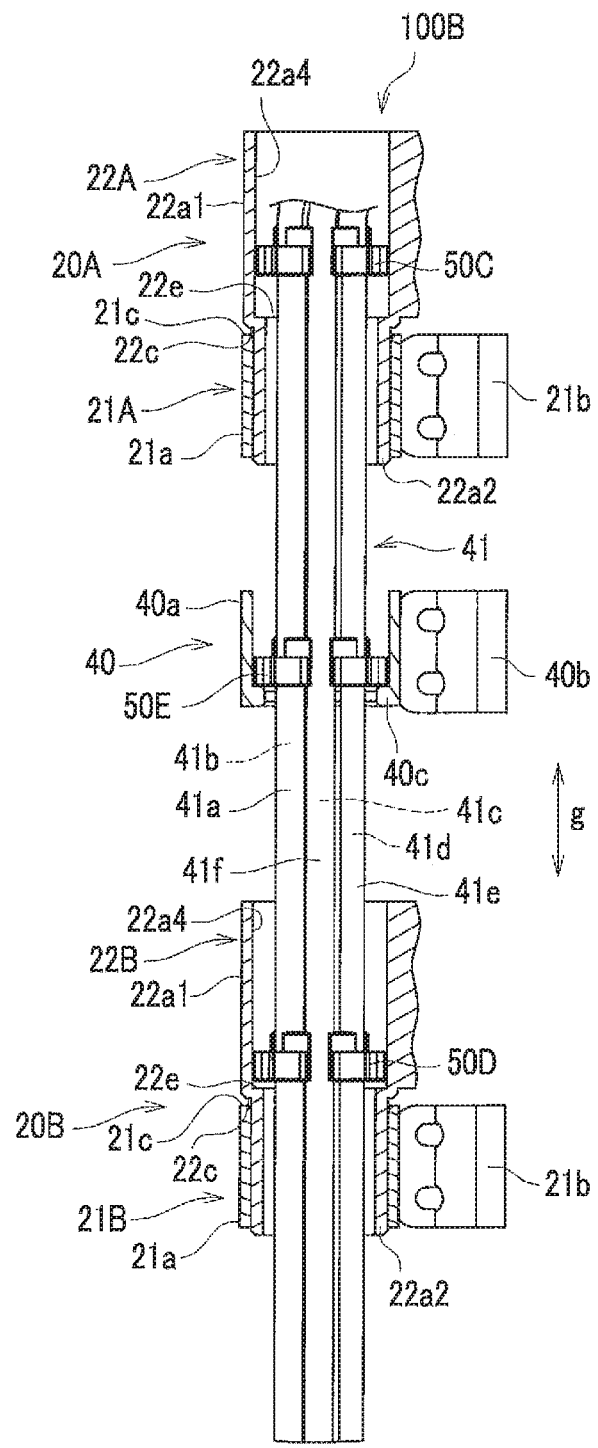

[FIG. 15]
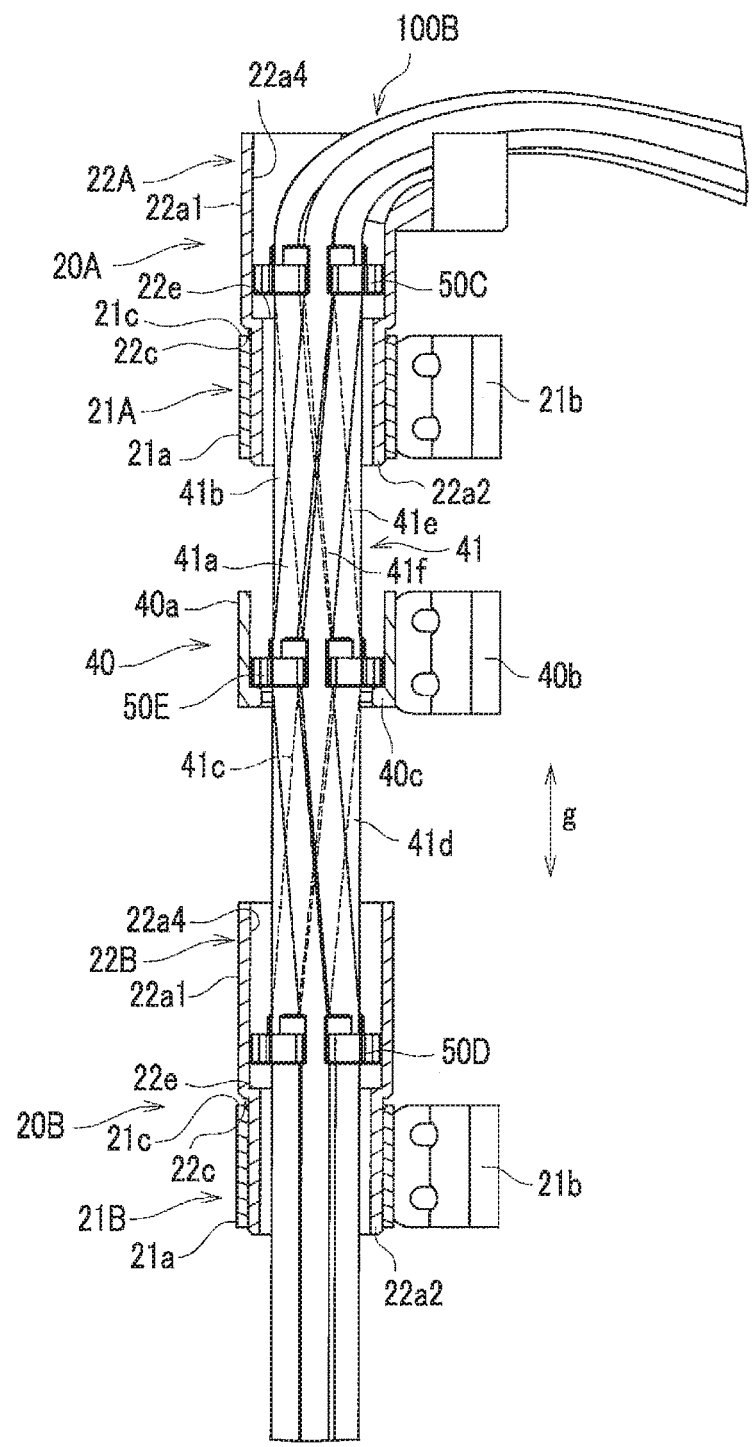

[FIG. 16]
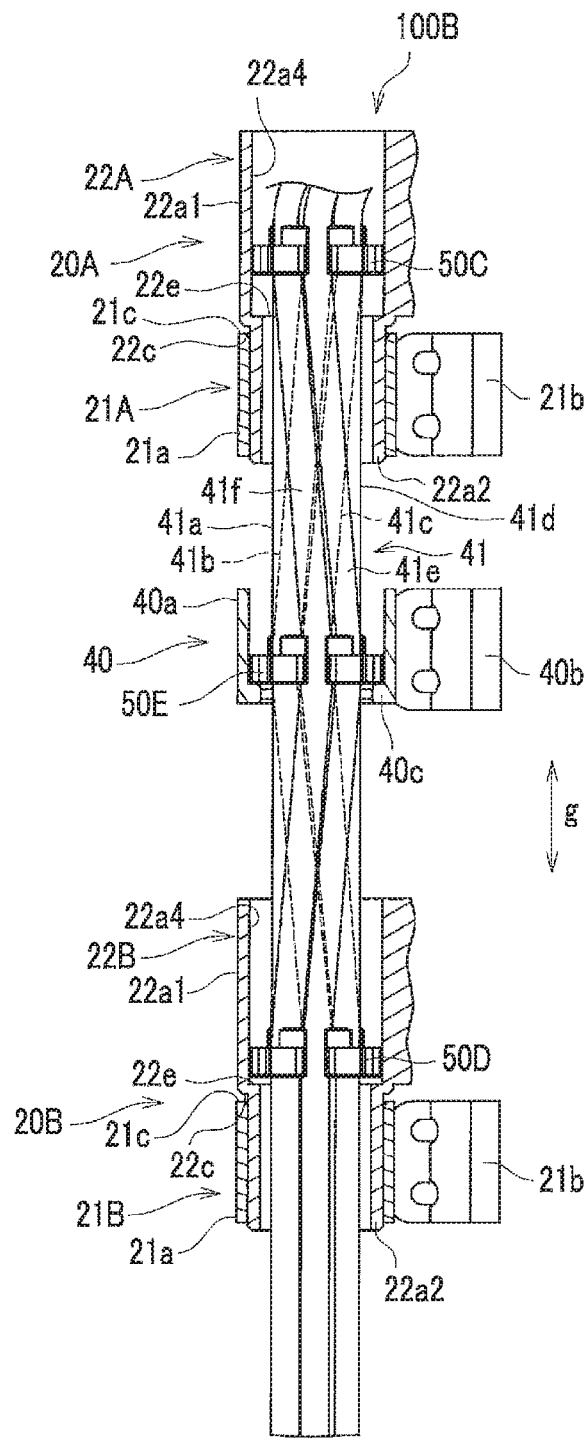

[FIG. 17]
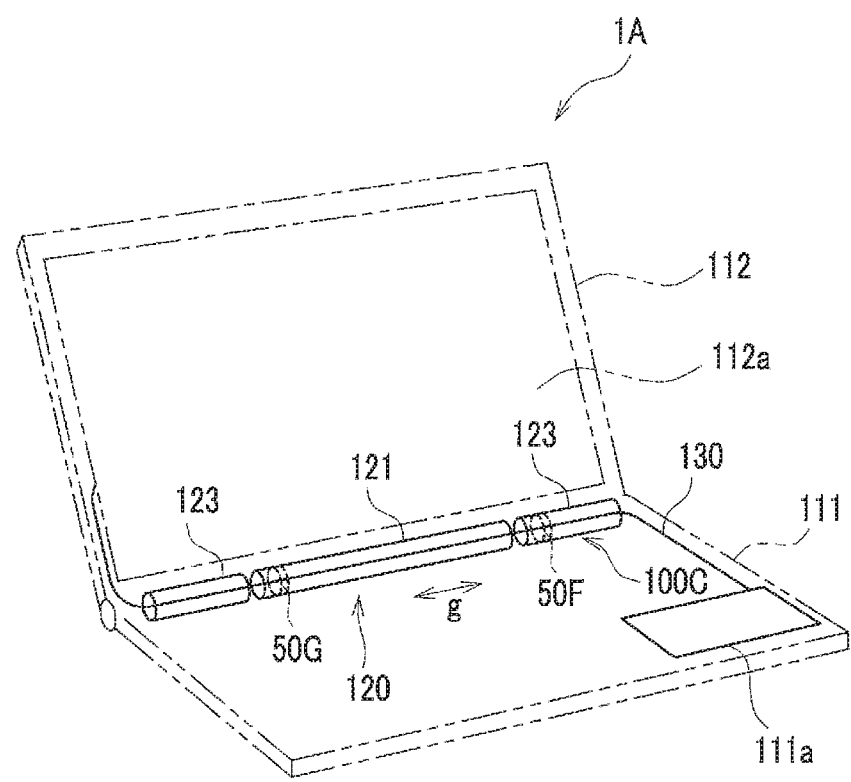

WIRING GUIDE MECHANISM AND ELECTRONIC DEVICE

TECHNICAL FIELD

The present invention relates to a wiring guide mechanism and an electronic device including the same.

BACKGROUND ART

In recent years, as a device which analyzes DNA, a capillary electrophoresis device in which a capillary is filled with an electrophoretic medium such as a polymer gel or a polymer solution is widely used. In such a device, a door which is opened and closed when a capillary is attached to or detached from a device body is rotatably attached, and a computer (for example, a computer body and a display) is connected to the device body via a cable (see Patent Literature 1).

In order to reduce an installation space of the entire device including the computer, for example, when the door of the device body is provided with a computer function, it is necessary to electrically connect the device body and the door via wires. Therefore, an electronic device including a hinge mechanism which rotatably links a first housing and a second housing, and in which the wires pass through a cylinder of the hinge mechanism is described (for example, see Patent Literature 2).

PRIOR ART LITERATURE

Patent Literature

PTL 1: JP-A-2001-281221
PTL 2: JP-A-2006-67267

SUMMARY OF INVENTION

Technical Problem

However, in the device described in Patent Literature 2, at the time of opening and closing the door, a load such as twisting, bending, pulling, and rubbing between the wires is applied to the wires, thereby causing breakage and wear of the wires.

The invention has been made to solve the above problems, and an object thereof is to provide a wiring guide mechanism in which the load applied to the wires can be reduced, and an electronic device including the wiring guide mechanism.

Solution to Problem

The invention includes a hinge member which rotatably links a device body and a door; a wire which electrically connects a door side with a device body side; and a plurality of retention members which retain the wires and are attached to the hinge members, wherein the plurality of retention members are disposed spaced apart from each other in an axial direction of the hinge members, and rotate relative to each other on the same axis in accordance with a rotation operation of the door.

Advantageous Effect

According to the invention, it is possible to provide a wiring guide mechanism and an electronic device in which the load applied to the wires can be reduced.

BRIEF DESCRIPTION OF DRAWINGS

FIG. 1 is an external perspective view showing an analysis device including a wiring guide mechanism according to a first embodiment.

FIG. 2 is a partially cutaway perspective view showing a door of the analysis device including the wiring guide mechanism according to the first embodiment.

FIG. 3 is a partially cutaway perspective view showing the door of the analysis device when the wiring guide mechanism according to the first embodiment is cut at a position of the hinge member.

FIG. 4 is a block diagram showing the analysis device including the wiring guide mechanism according to the first embodiment.

FIG. 5 is a partial cross-sectional side view showing the wiring guide mechanism according to the first embodiment.

FIG. 6 is a perspective view showing a moving-side wiring retention member attached to a moving-side hinge.

FIG. 7 is a plan view showing a state in which the moving-side wiring retention member is attached to the moving-side hinge.

FIG. 8 is a perspective view showing a fixed-side wiring retention member attached to a fixed-side hinge.

FIG. 9 is a plan view showing a state in which the fixed-side wiring retention member is attached to the fixed-side hinge.

FIG. 10 is an explanatory view showing an operation of the door.

FIG. 11 is a partial cross-sectional side view showing the wiring guide mechanism when the door is fully closed in FIG. 10.

FIG. 12 is a partial cross-sectional side view showing the wiring guide mechanism in the course of opening or closing the door in FIG. 10.

FIG. 13 is a partial cross-sectional side view showing the wiring guide mechanism when the door is fully opened in FIG. 10.

FIG. 14 is a side view showing a wiring guide mechanism according to a second embodiment in the course of opening or closing a door.

FIG. 15 is a side view showing the wiring guide mechanism according to the second embodiment when the door is fully closed.

FIG. 16 is a side view of the wiring guide mechanism according to the second embodiment when the door is fully opened.

FIG. 17 is a schematic diagram showing an electronic device including a wiring guide mechanism according to a third embodiment.

DESCRIPTION OF EMBODIMENTS

Next, embodiments of the invention will be described in details with reference to the drawings as appropriate. In each drawing, common portions are denoted by the same reference numerals, and a repetitive description thereof will be omitted.

First Embodiment

FIG. 1 is an external perspective view showing an analysis device including a wiring guide mechanism according to a first embodiment.

As shown in FIG. 1, an analysis device 1 including a wiring guide mechanism 100A (see FIG. 3) according to the first embodiment shows the appearance of an electronic device which analyzes a DNA base sequence, and includes a device body 2 and a door 3.

The device body 2 includes a control board 2b inside a housing 2a. In the device body 2, one universal serial bus (USB) port 2c is provided on a front surface of the housing 2a. Leg portions 2d, 2d, and 2d (partially not shown) are provided on a bottom surface of the device body 2.

The door 3 is provided at an upper front of the device body 2, and is rotatably opened and closed via a hinge mechanism (see FIG. 2) described later. A touch panel computer (hereinafter referred to as a touch panel PC) 3a is provided as an operation unit on a front surface of the door 3. The touch panel PC 3a can analyze the detection data in a central processing unit (CPU), and can display an analysis result on a display for confirmation. The door 3 is provided with a viewing window 3b on a lower side of the touch panel PC 3a through which a state of an inner portion can be visually confirmed.

FIG. 2 is a partially cutaway perspective view showing the door of the analysis device including the wiring guide mechanism according to the first embodiment. FIG. 2 shows the door 3 and a part (frame member 2e) of the device body 2 on which the door 3 is supported.

The hinge mechanism 10 includes a pair of hinge members 20, 30, and is provided at a left end of the door 3. The hinge member 20 and the hinge member 30 are disposed spaced apart from each other in a vertical direction (upper-lower direction). In the first embodiment, although the case where the hinge members 20, 30 are provided will be described as an example, a configuration including one hinge member may be provided.

The hinge member 20 is positioned at an upper portion of the door 3, and includes a fixed-side hinge 21 fixed to the device body 2, and a moving-side hinge 22 fixed to the door 3.

The fixed-side hinge 21 includes a fixed cylindrical portion 21a which has a cylindrical shape, and a fixing piece 21b which extends from an outer surface of the fixed cylindrical portion 21a toward the device body 2.

The moving-side hinge 22 includes a moving cylindrical portion 22a which has a cylindrical shape, and a guide member 22b which guides a wiring group 41 toward the touch panel PC 3a.

The fixed cylindrical portion 21a is linked so as to be fitted externally to a lower portion of the moving cylindrical portion 22a (so as to be spigot-fitted), and the moving cylindrical portion 22a is configured to rotate while sliding with respect to the fixed cylindrical portion 21a.

The hinge member 30 is positioned at a lower portion of the door 3, and includes a fixed-side hinge 31 fixed to the device body 2, and a moving-side hinge 32 fixed to the door 3.

The fixed-side hinge 31 includes a fixed cylindrical portion 31a which has a cylindrical shape, and a fixing piece 31b which extends from an outer surface of the fixed cylindrical portion 31a toward the device body 2.

The moving-side hinge 32 includes a moving cylindrical portion 32a which has a cylindrical shape.

The fixed cylindrical portion 31a is linked so as to be fitted externally to a lower portion of the moving cylindrical portion 32a (so as to be spigot-fitted), and the moving cylindrical portion 32a is configured to rotate while sliding with respect to the fixed cylindrical portion 31a.

One end of the wiring group 41 is connected to the touch panel PC 3a of the door 3, and the other end of the wiring group 41 extends toward the device body 2 (see FIG. 1). The wiring group 41 is inserted into the moving cylindrical portion 22a, the fixed cylindrical portion 21a, the moving cylindrical portion 32a, and the fixed cylindrical portion 31a separately.

FIG. 3 is a partially cutaway perspective view showing the door of the analysis device when the wiring guide mechanism according to the first embodiment is cut at a position of the hinge member. FIG. 3 shows a state in which the fixed cylindrical portion 21a, the moving cylindrical portion 22a, the fixed cylindrical portion 31a, and the moving cylindrical portion 32a shown in FIG. 2 are cut in an axial direction g of the hinge mechanism 10.

As shown in FIG. 3, the wiring guide mechanism 100A includes the hinge members 20, 30, the wiring group 41 (wires 41a, 41b, 41c, 41d, 41e, and 41f), a moving-side wiring retention member 50A, and a fixed-side wiring retention member 50B (a plurality of retention members).

The wiring group 41 is configured by bundling six wires 41a to 41f. Although six wires 41a to 41f will be described as an example in the present embodiment, the number of wires is not limited to six, and may be equal to or less than five or equal to or more than seven. The number is not limited to plural, and may be one.

The moving-side wiring retention member 50A is attached to the moving-side hinge 22 of the hinge member 20. That is, the moving-side wiring retention member 50A is inserted into the moving cylindrical portion 22a of the moving-side hinge 22, and retains the wires 41a to 41f individually one by one.

The fixed-side wiring retention member 50B is attached to the fixed-side hinge 31 of the hinge member 30. That is, the fixed-side wiring retention member 50B is inserted into the fixed cylindrical portion 31a of the fixed-side hinge 31, and retains the wires 41a to 41f individually one by one.

The fixing piece 21b provided on the fixed-side hinge 21 is formed to bend in an L-shape, with one end joined to the fixed cylindrical portion 21a, and the other end fixed to the device body 2 through a hole 3e formed in a panel cover 3d that covers a back surface of the door 3.

The fixing piece 31b provided on the fixed-side hinge 31 is formed to bend in an L-shape, with one end joined to the fixed cylindrical portion 31a, and the other end fixed to the device body 2 through a hole 3f formed in the panel cover 3d that covers the back surface of the door 3.

A part of the moving cylindrical portions 22a, 32a are fixed to the panel cover 3d of the door 3.

The wiring group 41 is bent so as to extend in a width direction of the door 3 by the guide member 22b at an upper portion of the moving cylindrical portion 22a, and is electrically connected to the touch panel PC 3a of the door 3. Although not shown, the wiring group 41 further extends downward from the fixed cylindrical portion 31a and extends to a side of the device body 2 (see FIG. 1).

FIG. 4 is a block diagram showing the analysis device including the wiring guide mechanism according to the first embodiment.

As shown in FIG. 4, one end of each of the wires 41a, 41b, 41c, 41d, 41e, and 41f is connected to the touch panel PC 3a provided on the door 3. In the analysis device 1, electric power is supplied from an external power supply 4, and the supplied electric power is supplied to the control board 2b.

The other ends of the wires 41a, 41b are connected to the control board 2b. The wire 41a includes a power line that transmits the electric power supplied to the control board 2b to the touch panel PC 3a. The wire 41b includes a communication line for LAN communication which exchanges information between the control board 2b and the touch panel PC 2a.

The other ends of the wires 41c, 41d, and 41e are respectively connected to two USB ports 2f, 2g and a LAN port 2h formed on a back surface of the device body 2. The other end of the wiring 41f is connected to a USB port 2c formed on a front surface of the device body 2.

In the analysis device 1, the wires 41a, 41b are connected to the control board 2b, the wires 41c to 41f are connected to external interfaces of the USB ports 2c, 2f, and 2g, and the LAN port 2h, and the wires may connect both inner side and outer side of the device body 2, and therefore, the wires are not connected to the device body 2 but a device body 2 side (control board 2b and/or housing). Further, the door 3 side can be similarly configured, and therefore, the wires are connected to a door 3 side (touch panel PC 3a and/or the housing).

FIG. 5 is a partial cross-sectional side view showing the wiring guide mechanism according to the first embodiment.

As shown in FIG. 5, in the hinge member 20, the moving cylindrical portion 22a of the moving-side hinge 22 includes an upper cylindrical body 22a1 into which the moving-side wiring retention member 50A is inserted, and a lower cylindrical body 22a2 having a diameter smaller than the upper cylindrical body 22a1. An inner diameter dimension R2 of the lower cylindrical body 22a2 is formed to be smaller than an inner diameter dimension R1 of the upper cylindrical body 22a1. The moving-side hinge 22 has a stepped portion 22e formed at a boundary between the upper cylindrical body 22a1 and the lower cylindrical body 22a2 when the inner diameter thereof is reduced.

An outer diameter of the moving-side wiring retention member 50A is formed to be larger than the inner diameter dimension R2 of the lower cylindrical body 22a2. Accordingly, it possible to restrict the moving-side wiring retention member 50A from moving from the upper cylindrical body 22a1 to the lower cylindrical body 22a2, and thus, the moving-side wiring retention member 50A can be prevented from falling off from the moving-side hinge 22.

An outer diameter of the lower cylindrical body 22a2 is formed to be smaller than an outer diameter of the upper cylindrical body 22a1, and the fixed cylindrical portion 21a is attached so as to be fitted externally to the lower cylindrical body 22a2. Accordingly, a step portion 22c having an outer diameter reduced is formed at the boundary between the upper cylindrical body 22a1 and the lower cylindrical body 22a2, and the step portion 22c abuts against an end face 21c of the fixed cylindrical portion 21a in the axial direction g (a rotational axis direction of the hinge member 20), so that the moving-side hinge 22 is supported by the fixed-side hinge 21.

The fixed cylindrical portion 21a has a cylindrical shape in which both ends in the axial direction g are open, and an entire inner peripheral surface 21a1 of the fixed cylindrical portion 21a rotates while sliding on an outer peripheral surface 22a3 of the lower cylindrical body 22a2 of the moving-side hinge 22.

The wires 41a to 41f are not in contact with an inner wall surface 22a4 of the upper cylindrical body 22a1 and an inner wall surface 22a5 of the lower cylindrical body 22a2.

In the hinge member 30, the moving cylindrical portion 32a of the moving-side hinge 32 includes an upper cylindrical body 32a1 and a lower cylindrical body 32a2 having an outer diameter smaller than that of the upper cylindrical body 32a1. An inner diameter dimension R3 of the moving cylindrical portion 32a is formed to have the same diameter from one end (upper end) to the other end (lower end) in the axial direction g (the rotational axis direction of the hinge member 30).

A flange 31c protruding toward the center in a radial direction is formed at a lower end of the fixed-side hinge 31 so as to have a smaller diameter than the fixed-side wiring retention member 50B. Accordingly, the fixed-side wiring retention member 50B is configured not to fall off from the fixed-side hinge 31.

An outer diameter of the lower cylindrical body 32a2 of the moving-side hinge 32 is formed to be smaller than an outer diameter of the upper cylindrical body 32a1, and the fixed cylindrical portion 31a is attached so as to be fitted externally to the lower cylindrical body 32a2. Accordingly, a step portion 32c having an outer diameter reduced is formed at the boundary between the upper cylindrical body 32a1 and the lower cylindrical body 32a2, and the step portion 32c abuts against an end face 31d of the fixed cylindrical portion 31a in the axial direction g, so that the moving-side hinge 32 is supported by the fixed-side hinge 31.

A length of the lower cylindrical body 32a2 in the axial direction g is formed to be shorter than a length of the fixed cylindrical portion 31a in the axial direction g, and an inner wall surface 31a1 of the fixed cylindrical portion 31a rotates while sliding on an entire outer peripheral surface 32a3 of the lower cylindrical body 32a2.

The fixed-side wiring retention member 50B is provided in a lower portion of the fixed cylindrical portion 31a at a position where the fixed cylindrical portion 31a and the lower cylindrical body 32a2 do not overlap with each other.

The wires 41a to 41f are not in contact with an inner wall surface 32a4 parallel to the upper cylindrical body 32a1 and the lower cylindrical body 32a2 in the axial direction g, the inner wall surface 31a1 of the fixed cylindrical portion 31a, and an inner edge portion 31c1 of the flange 31c.

In this way, the moving-side hinges 22, 32 are supported on upper sides of the fixed-side hinges 21, 31, so that the door 3 can be stably and reliably retained in the device body 2 even if the door 3 has a large weight on which the touch panel PC 3a is mounted.

FIG. 6 is a perspective view showing the moving-side wiring retention member attached to the moving-side hinge.

As shown in FIG. 6, the moving-side wiring retention member 50A has a base portion 51 having a substantially columnar shape whose diameter is smaller than the inner diameter dimension R1 (see FIG. 5) of the upper cylindrical body 22a1 (see FIG. 5). On an outer peripheral surface 51a of the base portion 51, six protruding portions 52 which protrude radially outward are formed at intervals in a circumferential direction (at intervals of every 60°). Each of the protruding portions 52 has the same shape except for one, and is formed to be shorter than a length of the base portion 51 in the axial direction g. A lower surface of the protruding portion 52 is configured to coincide with a lower surface of the base portion 51.

A groove 53 extending linearly in the upper-lower direction is formed in one of the six protruding portions 52. An upper end portion and a lower end portion of the groove 53 are opened toward an upper surface and a lower surface of the protruding portion 52.

On the outer peripheral surface 51a of the base portion 51, wiring retention portions 54, 54, 55, 55, 55, and 55 which are recessed toward the center in the radial direction are formed between the adjacent protruding portions 52. The wiring retention portions 54, 54, 55, 55, 55, and 55 are formed at intervals in the circumferential direction.

The wiring retention portions 54, 54 are formed with a cross-sectional shape matching with outer diameters of the wires 41a, 41b (see FIG. 5). The wiring retention portions 55, 55, 55, and 55 are formed with a cross-sectional shape matching with outer diameters of the wires 41c, 41d, 41e, and 41f (see FIG. 5).

One wiring retention portion 54 retains one wire 41a (41b), and respective wires are retained while being spaced apart from each other. One wiring retention portion 55 retains one wire 41c (41d, 41e, and 41f), and respective wires are retained while being spaced apart from each other. One wire 41a (41b, 41c, 41d, 41e, or 41f) means one which can be recognized as one line in appearance. In the present embodiment, the wires 41a to 41f having a circular shape are described as an example, but the wire may also have a rectangular shape, a polygonal shape, or other irregular shapes.

The material of the moving-side wiring retention member 50A may be a resin or a metal as long as the wires 41a to 41f can be retained thereby. Examples of the resin include an ABS resin and a PLA resin.

FIG. 7 is a plan view showing a state in which the moving-side wiring retention member is attached to the moving-side hinge.

As shown in FIG. 7, an outer peripheral surface 52a of each protruding portion 52 is formed with the same curvature as the inner wall surface 22a4 of the upper cylindrical body 22a1, and is configured to slide freely and reciprocally in the axial direction g of the upper cylindrical body 22a1.

The wiring retention portion 54 has a diameter larger than the wiring retention portion 55, and an opening width W1 of a peripheral surface (side surface) is formed to be shorter than a diameter R10 of the wiring retention portion 54. Similarly, an opening width W2 of a peripheral surface (side edge) of the wiring retention portion 55 is formed to be shorter than a diameter R11 of the wiring retention portion 55.

Accordingly, by pushing the wires 41a to 41f from an outer peripheral side of the base portion 51, the wires 41a to 41f can be easily retained, and the moving-side wiring retention member 50A can be easily replaced.

The center in a radial direction of the moving-side wiring retention member 50A coincides with the center in a radial direction of the upper cylindrical body 22a1 at a point O. In other words, the center of the moving-side wiring retention member 50A coincides with the rotation center of the hinge member 20 at the point O.

A protrusion 22s of a ridge extending in the axial direction g (see FIG. 5) is formed on the inner wall surface 22a4 of the upper cylindrical body 22a1. The protrusion 22s is inserted into the groove 53 of the moving-side wiring retention member 50A. The moving-side wiring retention member 50A can slide in the axial direction g in the upper cylindrical body 22a1, and cannot rotate in a circumferential direction.

In the moving-side wiring retention member 50A, since the wiring retention portions 54, 55 are formed long in the axial direction g (see FIG. 5), the wires 41a to 41f can be reliably retained. Since the protruding portion 52 is formed short in the axial direction g (see FIG. 5), the frictional resistance between the protruding portion 52 and the upper cylindrical body 22a1 is reduced, and the moving-side wiring retention member 50A can be moved smoothly and reciprocally.

FIG. 8 is a perspective view showing the fixed-side wiring retention member attached to the fixed-side hinge. The same configurations as those of the moving-side wiring retention member 50A are denoted by the same reference numerals, and a repetitive description thereof will be omitted.

As shown in FIG. 8, in the fixed-side wiring retention member 50B, a recessed portion 56 is formed in one of the six protruding portions 52. The recessed portion 56 has a substantially rectangular shape, and has side surfaces 56a, 56a positioned on both sides in a circumferential direction and a bottom surface 56b positioned on a lower side. The recessed portion 56 is opened toward an upper side.

FIG. 9 is a plan view showing a state in which the fixed-side wiring retention member is attached to the fixed-side hinge.

As shown in FIG. 9, the fixed-side wiring retention member 50B is inserted to a bottom of the fixed cylindrical portion 31a, and a screw 57 is screwed from an outside of the fixed cylindrical portion 31a at a height position of the recessed portion 56, and a tip of the screw 57 is screwed into the recessed portion 56, so that the fixed-side wiring retention member 50B is fixed in the fixed cylindrical portion 31a.

Accordingly, the fixed-side wiring retention member 50B cannot rotate within the fixed cylindrical portion 31a. The screw 57 abuts against the bottom surface 56b of the recessed portion 56, so that the fixed-side wiring retention member 50B is restricted from moving upward in the fixed cylindrical portion 31a. That is, the fixed-side wiring retention member 50B is fixed so as not to move in the upper-lower direction (axial direction g) and in the circumferential direction in the fixed cylindrical portion 31a.

The center in a radial direction of the fixed-side wiring retention member 50B coincides with the center in a radial direction of the fixed cylindrical portion 31a at the point O. In other words, the center of the fixed-side wiring retention member 50B coincides with a rotation center of the hinge member 30 (see FIG. 5) at the point O. The center of the fixed-side wiring retention member 50B coincides with the center of the moving-side wiring retention member 50A at the point O, and the rotation center of the hinge member 30 coincides with the rotation center of the hinge member 20 at the point O (see FIGS. 7 and 9). Therefore, the moving-side wiring retention member 50A rotates with respect to the fixed-side wiring retention member 50B on the same axis. With the rotation of the moving-side wiring retention member 50A, the moving-side wiring retention member 50A and the fixed-side wiring retention member 50B rotate relative to each other on the same axis.

Next, the operation of the wiring guide mechanism 100A accompanying the opening and closing of the door 3 will be described with reference to FIGS. 10 to 13. FIG. 10 is an explanatory view showing an operation of the door. FIG. 11 is a partial cross-sectional side view showing the wiring guide mechanism when the door is fully closed in FIG. 10. FIG. 12 is a partial cross-sectional side view showing the wiring guide mechanism in the course of opening or closing the door in FIG. 10. FIG. 13 is a partial cross-sectional side view showing the wiring guide mechanism when the door is fully opened in FIG. 10. The hinge members 20, 30 shown in FIGS. 11 to 13 show a cross section when viewed from a front side of the device body 2. In the present embodiment, the moving-side wiring retention member 50A and the fixed-side wiring retention member 50B are fixed such that the wires 41a to 41f and the wiring retention portions 54, 54, 55, 55, 55, and 55 do not slide relative to each other.

As shown in FIG. 10, the analysis device 1 includes the door 3 that rotates about one end (left end) in a width direction as a rotational axis. The left view of FIG. 10 shows a state of the door 3 when fully closed, the central view of FIG. 10 shows a state of the door 3 in the course of opening or closing (half of the fully opened angle), and the right view of FIG. 10 shows a state of the door 3 when fully opened. The door 3 according to the present embodiment is configured to open 120° when fully opened. In the present embodiment, the case where a left side of the door 3 is taken as the rotational axis is described as an example, but as long as the hinge mechanism is included, a right side of the door 3 may be taken as the rotational axis, the upper portion of the door 3 may be taken as the rotational axis, or the lower portion of the door 3 may be taken as the rotational axis.

As shown in FIG. 11, when the door 3 is fully closed (see the left view of FIG. 10), the wires 41a to 41f retained by the moving-side wiring retention member 50A are in a state of being rotated by 60° (a state in which a twist angle is 60°) with respect to the wires 41a to 41f retained by the fixed-side wiring retention member 50B. In other words, in the retention member 50A of FIG. 7, the wires are in a state of being rotated about 60° (for example, the angle from one wiring retention portion 54 to the other wiring retention portion 54) in a counterclockwise direction with the point O as a rotational axis center. At this time, the wires 41a to 41f retained at a position of the moving-side wiring retention member 50A are set to be spaced apart from each other. The wires 41a to 41f retained at a position of the fixed-side wiring retention member 50B are set to be spaced apart from each other. The wires 41a to 41f positioned between the moving-side wiring retention member 50A and the fixed-side wiring retention member 50B are also set to be spaced apart from each other. Therefore, in a state where the door 3 is closed, the wires 41a to 41f are not in contact with each other between the moving-side wiring retention member 50A and the fixed-side wiring retention member 50B.

In the fully closed state shown in FIG. 11, the wires 41a to 41f move so as to twist 60° in the circumferential direction, and thus the moving-side wiring retention member 50A slides downward in the moving-side hinge 22. In this way, the moving-side wiring retention member 50A slides in the axial direction g, so that the wires 41a to 41f can be prevented from being pulled in the axial direction (longitudinal direction), and a load applied to the wires 41a to 41f can be reduced.

As shown in FIG. 12, when the door 3 is opened by 60° from the fully closed state (see the center view of FIG. 10), the moving-side hinges 22, 32 are rotated by 60° in conjunction with the rotation of the door 3, and the door 3 reaches the course of opening or closing. At this time, the fixed-side wiring retention member 50B is fixed to the fixed-side hinge 31, so that the fixed-side wiring retention member 50B does not rotate, and the moving-side hinge 22 is rotated by 60° around the rotational axis center of the hinge members 20, 30 together with the moving-side wiring retention member 50A. Accordingly, the wires 41a to 41f extend straightly in the vertical direction. That is, each of the wiring retention portions 54, 54, 55, 55, 55, and 55 of the moving-side wiring retention member 50A coincides with each of the wiring retention portions 54, 54, 55, 55, 55, and 55 of the fixed-side wiring retention member 50B in the vertical direction. Therefore, the wires 41a to 41f are in a state with no twisting movement (a state where a twist angle is 0°).

Since the distance in the axial direction (length direction) of the wires 41a to 41f positioned between the moving-side wiring retention member 50A and the fixed-side wiring retention member 50B becomes longer by reaching the state in the course of opening or closing of FIG. 12 from the fully closed state of FIG. 11, the moving-side wiring retention member 50A slides upward inside the moving-side hinge 22. In this case, it is possible to prevent the action of a force that forcedly contract the wires 41a to 41f, so as to reduce the load applied to the wires 41a to 41f.

As shown in FIG. 13, when the door 3 is further opened by 60° from the course of opening or closing of FIG. 12, the moving-side hinges 22, 32 are rotated by 60° around the rotational axis center of the hinge members 20, 30 in conjunction with the rotation of the door 3. At this time, the fixed-side wiring retention member 50B is fixed to the fixed-side hinge 31, so that the fixed-side wiring retention member 50B does not rotate, and the moving-side hinge 22 is rotated by 60° together with the moving-side wiring retention member 50A. Accordingly, as shown in FIG. 13, the wires 41a to 41f are in a state of being rotated to a side opposite to that in FIG. 11 (a state in which the twist angle is 60°).

In this way, in the analysis device 1 including the wiring guide mechanism 100A, the twist angle of the wires 41a to 41f becomes 0° in the course of opening or closing the door 3; the twist angle of the wires 41a to 41f becomes 60° (predetermined angle) in the state where the door 3 is fully closed; and the twist angle of the wires 41a to 41f becomes 60° (60° in a reverse direction to that when fully closed) in the state where the door 3 is fully opened. Accordingly, since the twist angle of the wires 41a to 41f can be 60° at the maximum, the twist angle can be minimized and the load applied to the wires 41a to 41f can be reduced.

However, if a diameter of the wiring retention member is increased and a gap between the wires is increased, the wires are difficult to come into contact with each other even if the twist angle of the wires is increased, but if the diameter of the wiring retention member is increased, it is also necessary to enlarge the hinge member, and the device becomes large. Therefore, in the present embodiment, the twist angle can be reduced, so that the wires 41a to 41f can be not in contact with each other even if gaps therebetween become small, and the moving-side wiring retention member 50A and the fixed-side wiring retention member 50B can be downsized. Accordingly, the analysis device 1 can be compactly configured.

As described above, the present embodiment includes the hinge members 20, 30 which rotatably link the device body 2 and the door 3, the wires 41a to 41f which electrically connect the door 3 side (touch panel PC 3a) and the device body 2 side (the control board 2b and the ports 2c, 2f, 2g, and 2h), and the moving-side wiring retention member 50A and the fixed-side wiring retention member 50B which retain the wires 41a to 41f and are attached to the hinge members 20, 30. The moving-side wiring retention member 50A and the fixed-side wiring retention member 50B are disposed spaced apart in an axial direction g of the hinge members 20, 30. The plurality of the moving-side wiring retention members 50A and the plurality of the fixed-side wiring retention members 50B rotate relative to each other on the same axis in accordance with a rotation operation of the door 3 (see FIG. 5). In this way, the wires 41a to 41f are moved (rotated) while being twisted, so that the wires 41a to 41f themselves can be prevented from being twisted and the load applied to the wires 41a to 41f can be reduced when the door 3 is opened or closed. As a result, breakage and wear of the wires can be prevented.

In the present embodiment, a plurality of wires 41a to 41f are configured, and the moving-side wiring retention member 50A and the fixed-side wiring retention member 50B retain the wires 41a to 41f apart from each other in the circumferential direction. Accordingly, rubbing between the wires 41a to 41f at the time of opening or closing the door 3 can be prevented, and the load applied to the wires 41a to 41f can be reduced. As a result, breakage and wear of the wires can be more reliably prevented.

In the present embodiment, the hinge members 20, 30 have fixed-side hinges 21, 31 fixed to the device body 2, and moving-side hinges 22, 32 fixed to the door 3, and the fixed-side wiring retention member 50B (one retention member) is attached to the fixed-side hinge 31 of one hinge member 30, and the moving-side wiring retention member 50A (the other retention member) is attached to the moving-side hinge 22 of the other hinge member 20. Accordingly, the wires 41a to 41f can be stably (at a certain angle) twisted, and an excessive load on the wires 41a to 41f can be reduced.

In the present embodiment, the fixed-side hinges 21, 31 have fixed cylindrical portions 21a, 31a formed in a cylindrical shape, the moving-side hinges 22, 32 have moving cylindrical portions 22a, 32a formed in a cylindrical shape, and the fixed cylindrical portions 21a, 31a fit externally to the moving cylindrical portions 22a, 32a to support the moving cylindrical portions 22a, 32a. Accordingly, even when a device having a large weight such as the touch panel PC 3a is attached to the door 3, the door 3 can be stably supported by the device body 2.

In the present embodiment, the wires 41a to 41f are inserted into the fixed cylindrical portions 21a, 31a and the moving cylindrical portions 22a, 32a, and the fixed cylindrical portions 21a, 31a and the moving cylindrical portions 22a, 32a are disposed spaced apart from one another. Accordingly, rubbing between the wires 41a to 41f and the hinge members 20, 30 can be prevented.

In the present embodiment, the moving-side wiring retention member 50A attached to the moving-side hinge 22 is supported so as to be able to move reciprocally along the axial direction g of the moving-side hinge 22. Accordingly, when the wires 41a to 41f are fixed to each of the wiring retention portions 54, 54, 55, 55, 55, and 55 of the moving-side wiring retention member 50A, a strong force in a longitudinal direction can be prevented from acting on the wires 41a to 41f, and the load applied to the wires 41a to 41f can be reduced. As a result, breakage and wear of the wires can be prevented.

In the present embodiment, the wires 41a to 41f are fixed to the wiring retention portions 54, 55 of the moving-side wiring retention member 50A and the wiring retention portions 54, 55 of the fixed-side wiring retention member 50B. Accordingly, rubbing due to friction between the wires 41a to 41f and the wiring retention portions 54, 55 at the time of opening or closing the door 3 can be prevented.

In the present embodiment, the fixed-side wiring retention member 50B attached to the fixed-side hinge 31 is attached to the fixed-side hinge 31 so as not to move. Accordingly, the twist angle of the wires 41a to 41f can be easily controlled by being combined with the moving-side wiring retention member 50A.

Second Embodiment

FIG. 14 is a side view showing a wiring guide mechanism according to a second embodiment in the course of opening or closing a door. Although not shown, portions other than the wiring guide mechanism 100B (configuration of the analysis device 1) are the same as those in a first embodiment.

As shown in FIG. 14, the wiring guide mechanism 100B of the second embodiment includes hinge members 20A, 20B, and 40, the wires 41a to 41f, moving-side wiring retention members 50C and 50D, and a fixed-side wiring retention member 50E (a plurality of retention members).

The hinge member 20A includes a fixed-side hinge 21A and a moving-side hinge 22A. The fixed-side hinge 21A is formed with a fixing piece 21b to be fixed to the device body 2 (see FIG. 1).

The hinge member 20B includes a fixed-side hinge 21B and a moving-side hinge 22B. The fixed-side hinge 21B is formed with a fixing piece 21b to be fixed to the device body 2 (see FIG. 1).

The hinge member 40 includes a fixed cylindrical portion 40a formed in a cylindrical shape, and a fixing piece 40b to be fixed to the device body 2 (see FIG. 1).

The moving-side wiring retention member 50C is attached to the moving-side hinge 22A. The moving-side wiring retention member 50D is attached to the moving-side hinge 22B. The fixed-side wiring retention member 50E is attached to the hinge member 40. The moving-side wiring retention members 50C, 50D and the fixed-side wiring retention member 50E are disposed spaced apart in an axial direction g of the hinge members 20, 30 and 40.

The moving-side wiring retention members 50C, 50D are provided on the moving-side hinges 22A, 22B so as to be able to move reciprocally in the axial direction g and not to rotate in a circumferential direction. The fixed-side wiring retention member 50E is fixed to the hinge member 40 so as not to move in the axial direction g and the circumferential direction.

Next, the operation of the wiring guide mechanism 100B will be described with reference to FIGS. 14, 15 and 16. FIG. 15 is a side view showing the wiring guide mechanism according to the second embodiment when the door is fully closed. FIG. 16 is a side view of the wiring guide mechanism according to the second embodiment when the door is fully opened.

As shown in FIG. 14, in a course of opening or closing the door 3 (see the left view of FIG. 10), the twist angles of a plurality of wires 41a to 41f are 0°, and the wires 41a to 41f extend in parallel to each other in a vertical direction. When the door 3 is rotated by 60° in a closing direction from the state shown in FIG. 14, the state shown in FIG. 15 is reached. At this time, the moving-side hinges 22A, 22B are rotated by 60° in the same direction together with the moving-side wiring retention members 50C, 50D. By rotating the moving-side wiring retention member 50C by 60° with respect to the fixed-side wiring retention member 50E, the twist angle of the wires 41a to 41f becomes 60°. By rotating the moving-side wiring retention member 50D by 60° with respect to the fixed-side wiring retention member 50E, the twist angle of the wires 41a to 41f becomes 60°. Although not shown, the wires 41a to 41f are set so as not to contact each other between the moving-side wiring retention member 50C and the moving-side wiring retention member 50D as that in the first embodiment.

When the door 3 is rotated by 60° in an opening direction from the state shown in FIG. 14, the state shown in FIG. 16 is reached. At this time, the moving-side hinges 22A, 22B are rotated together with the moving-side wiring retention members 50C and 50D by 60° in a reverse direction to the above direction. By rotating the moving-side wiring retention member 50C by 60° with respect to the fixed-side wiring retention member 50E, the twist angle of the wires 41a to 41f becomes 60°. By rotating the moving-side wiring retention member 50D by 60° with respect to the fixed-side wiring retention member 50E, the twist angle of the wires 41a to 41f becomes 60°.

In this way, in the second embodiment, the load applied to the wires 41a to 41f accompanying the opening and closing operation of a door 3 can also be reduced, and breakage and wear of the wires 41a to 41f can be prevented as in the first embodiment. The other effects can be obtained in the same manner as in the first embodiment.

Third Embodiment

FIG. 17 is a schematic diagram showing an electronic device as a configuration of a third embodiment.

As shown in FIG. 17, the third embodiment shows a case where a wiring guide mechanism 100C is applied to an electronic device 1A. Here, although a notebook-type personal computer will be described as an example of the electronic device 1A, the electronic device 1A is not limited thereto, and other types of electronic device such as an analysis device, a portable terminal, and a camera can be used as long as the electronic device includes a hinge mechanism.

The wiring guide mechanism 100C includes a hinge member 120 which rotatably link a first housing 111 and a second housing 112, a wire 130 which electrically connects a first housing 111 side and a second housing 112 side, and a moving-side wiring retention member 50F and a fixed-side wiring retention member 50G (a plurality of retention members) which retain the wire 130 and are attached to the hinge member 120.

The first housing 111 has a rectangular plate shape and includes a control board 111a therein. The second housing 112 has a rectangular plate shape and includes a thin display device 112a such as a liquid crystal.

The hinge member 120 includes a fixed-side hinge 121 provided in the first housing 111, and moving-side hinges 122, 123 provided in the second housing 112. The fixed-side hinge 121 and the moving-side hinges 122, 123 are formed in a cylindrical shape so as to allow the wire 130 to pass therethrough separately. One end of the wire 130 is connected to the control board 111a, and the other end is connected to the thin display device 112a. The number of the wires 130 may be one, or more than one.

The moving-side wiring retention member 50F and the fixed-side wiring retention member 50G are disposed spaced apart in an axial direction g of the hinge member 120. In the third embodiment, the case where the moving-side wiring retention member 50F is provided on the moving-side hinge 122 (the right side in the diagram) is described as an example, but the moving-side wiring retention member 50F may be additionally provided on the moving-side hinge 123 (the left side in the diagram) as well.

The moving-side wiring retention member 50F is inserted into the moving-side hinge 122 so as to be supported in a manner of capable of moving reciprocally in the axial direction g and rotating in a circumferential direction. The fixed-side wiring retention member 50G is inserted into the fixed-side hinge 121 so as to be supported in a manner of not capable of moving in the axial direction g and not capable of rotating in a circumferential direction.

The moving-side wiring retention member 50F and the fixed-side wiring retention member 50G are configured to rotate relative to each other on the same axis in accordance with a rotation operation of the first housing 111 and the second housing 112. That is, in the third embodiment, the moving-side wiring retention member 50F is configured to rotate in a state where the fixed-side wiring retention member 50G is fixed.

According to the third embodiment, the load applied to the wire 130 can be reduced as that in the first and second embodiments. As a result, when the first housing 111 and the second housing 112 rotate relative to each other, twisting of the wire 130 itself can be prevented, and rubbing between the wires 130 can be prevented, so that breakage and wear of the wire 130 can be prevented.

The invention is not limited to the above embodiments. For example, it is possible to change a diameter of a circumference of an arrangement of a necessary wire according to the diameter of the wire, the number of the wire, and a full opening angle of the door 3. By minimizing a twist angle of the necessary wire, the circumference of the arrangement of the necessary wire is reduced, and a space for mounting can be minimized.

In the first and second embodiments, the case where the moving-side wiring retention members 50A, 50C, and 50D and the wires 41a to 41f are fixed, and the fixed-side wiring retention members 50B, 50E and the wires 41a to 41f are fixed is described as an example, but the moving-side wiring retention members 50A, 50C, and 50D and the wires 41a to 41f may not be fixed, and/or the fixed-side wiring retention members 50B, 50E and the wires 41a to 41f may not be fixed either.

REFERENCE SIGN LIST

1: analysis device (electronic device)
1A: electronic device
2: device body
2b: control board
3: door
3a: touch panel PC
10: hinge mechanism
20, 30: hinge member
21, 31: fixed-side hinge
21a, 31a: fixed cylindrical portion
22, 32: moving-side hinge
22a, 32a: moving cylindrical portion
41: wiring group
41a, 41b, 41c, 41d, 41e, 41f: wire
50A, 50C, 50D: moving-side wiring retention member (retention member)
50B, 50E: fixed-side wiring retention member (retention member)
100A, 100B, 100C: wiring guide mechanism
111: first housing
111a: control board
112: second housing
112a: thin display device
120: hinge member
121: fixed-side hinge
122, 123: moving-side hinge
130: wire

What is claimed is:
1. A wiring guide mechanism comprising:
a hinge member which rotatably links a device body and a door;
a wire which electrically connects a door side with a device body side; and
a plurality of retention members which retain the wire and are attached to the hinge member, wherein
the plurality of retention members are disposed spaced apart from each other in an axial direction of the hinge member, the plurality of retention members rotate relative to each other on a same axis in accordance with a rotation operation of the door, the wire is configured by a plurality of wires, and the plurality of retention members retain the plurality of the wires spaced apart from each other.

2. The wiring guide mechanism according to claim 1, wherein the hinge member includes a fixed-side hinge fixed to the device body, and a moving-side hinge fixed to the door, and one of the retention members is attached to the fixed-side hinge, and the other of the retention members is attached to the moving-side hinge.

3. The wiring guide mechanism according to claim 2, wherein the fixed-side hinge has a fixed cylindrical portion formed in a cylindrical shape, the moving-side hinge has a moving cylindrical portion formed in a cylindrical shape, and the fixed cylindrical portion fits externally to the moving cylindrical portion to support the moving cylindrical portion.

4. The wiring guide mechanism according to claim 3, wherein the wire is inserted into the fixed cylindrical portion and the moving cylindrical portion, and is disposed spaced apart from the fixed cylindrical portion and the moving cylindrical portion.

5. The wiring guide mechanism according to claim 2, wherein the retention member attached to the moving-side hinge is supported so as to move reciprocally in the axial direction.

6. The wiring guide mechanism according to claim 5, wherein the wire is fixed to the plurality of retention members.

7. The wiring guide mechanism according to claim 2, wherein the retention member attached to the fixed-side hinge is attached to the fixed-side hinge in a manner of not capable of moving in the axial direction and not capable of rotating in a circumferential direction.

8. The wiring guide mechanism according to claim 1, wherein a twist angle of the wire becomes 0 in the course of opening or closing the door, and the twist angle of the wire becomes a predetermined angle in a state where the door is closed.

9. An electronic device comprising:
the wiring guide mechanism according to claim 1.

10. A wiring guide mechanism comprising:

a hinge member which rotatably links a first housing and a second housing in an electronic device;

a wire which electrically connects a first housing side with a second housing side; and a plurality of retention members which retain the wire and are attached to the hinge member, wherein the plurality of retention members are disposed spaced apart from each other in an axial direction of the hinge member, and the plurality of retention members rotate relative to each other on a same axis in accordance with a rotation operation of the first housing and/or the second housing.

11. An electronic device comprising:
the wiring guide mechanism according to claim 10.

* * * * *